(12) United States Patent
Kurihara et al.

(10) Patent No.: US 8,541,733 B2
(45) Date of Patent: Sep. 24, 2013

(54) LASER LIGHT DETECTION CIRCUIT

(75) Inventors: Rui Kurihara, Gyouda (JP); Takahiro Kawashima, Ota (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 280 days.

(21) Appl. No.: 13/087,101

(22) Filed: Apr. 14, 2011

(65) Prior Publication Data

US 2011/0255565 A1 Oct. 20, 2011

(30) Foreign Application Priority Data

Apr. 16, 2010 (JP) ................................. 2010-095011

(51) Int. Cl.
*H03F 3/08* (2006.01)
*H01J 40/14* (2006.01)
*H03F 3/45* (2006.01)
*H03F 3/28* (2006.01)

(52) U.S. Cl.
USPC ....... 250/214 A; 250/214 R; 330/69; 330/123

(58) Field of Classification Search
USPC ................ 250/214 R, 214.1, 214 A, 214 LA, 250/214 LS, 214 SW; 330/69, 123, 252, 330/261, 297; 348/300–302, 308–313
See application file for complete search history.

(56) References Cited

U.S. PATENT DOCUMENTS

2010/0020217 A1* 1/2010 Abe et al. ...................... 348/308

FOREIGN PATENT DOCUMENTS

JP 2003-141767 5/2003

* cited by examiner

*Primary Examiner* — Georgia Y Epps
*Assistant Examiner* — Don Williams
(74) *Attorney, Agent, or Firm* — Morrison & Foerster LLP (57) ABSTRACT

The invention provides a laser light detection circuit that prevents a peak output occurring when the circuit switches between the operation stop mode and the operation mode so as to prevent the breakdown or malfunction of the next-connected circuit. A laser light detection circuit has a differential amplifier that amplifies and outputs a signal corresponding to the intensity of laser light, a drive transistor having a base to which the output of the differential amplifier is applied, a second constant-current source connected to the emitter of the drive transistor, an output transistor having a base connected to the emitter of the drive transistor, a bypass transistor connected between the emitter of the drive transistor and the ground, and a control circuit. The control circuit forms a bypass current route from the second constant-current source to the ground through the bypass transistor by turning on the bypass transistor when the circuit switches from the operation stop mode to the operation mode.

9 Claims, 6 Drawing Sheets

LASER LIGHT DETECTION CIRCUIT

CROSS-REFERENCE OF THE INVENTION

This application claims priority from Japanese Patent Application No. 2010-095011, the content of which is incorporated herein by reference in its entirety.

BACKGROUND OF THE INVENTION

1. Field of the Invention

The invention relates to a laser light detection circuit that outputs an electric signal corresponding to the intensity of laser light.

2. Description of the Related Art

In recent years, optical discs such as CD (the abbreviation of a compact disc) is rapidly prevailing and leading in the multimedia age. A Blu-ray Disc using a blue-violet semiconductor laser is developed as a new generation of optical disc.

Figure 6:
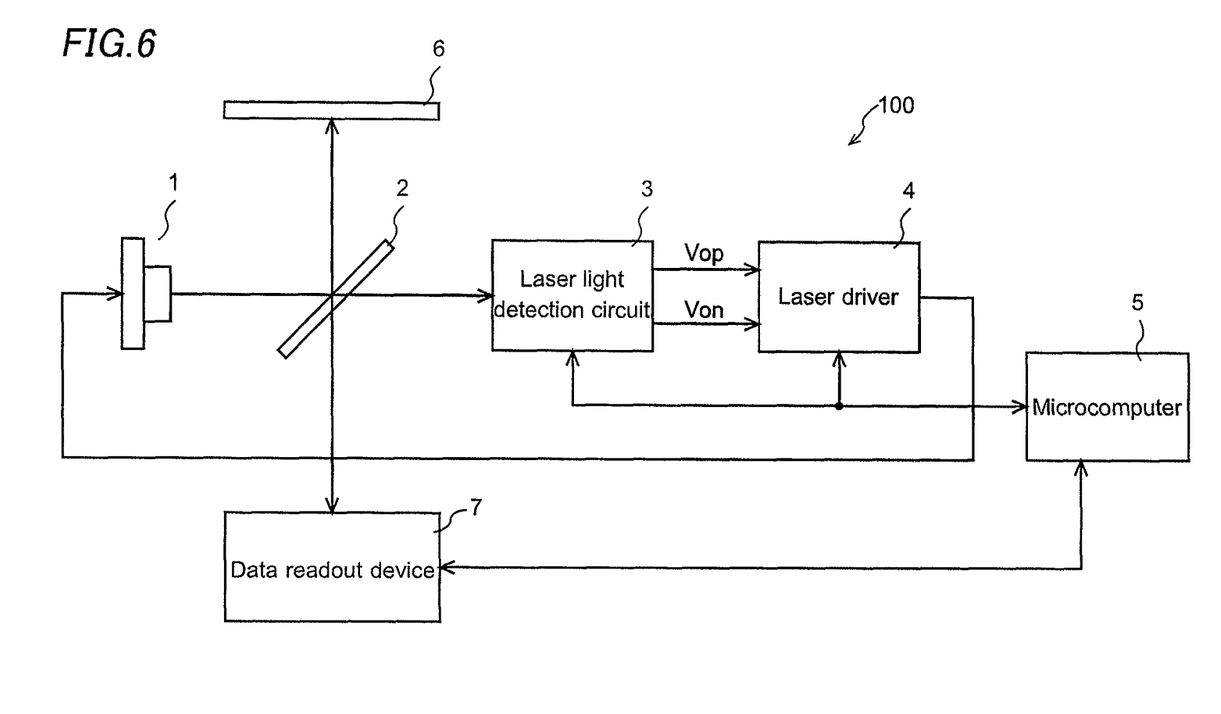
FIG. 6 is a schematic view showing a structure of an optical disc device.

FIG. 6 is a schematic view showing a structure of an optical disc device 100. The optical disc device 100 includes a semiconductor laser 1, a half mirror 2, a laser light detection circuit 3, a laser driver 4, a microcomputer 5, an optical disc 6 and a data readout device 7.

Laser light generated by the semiconductor laser 1 is reflected by the half mirror 2 and travels to the surface of the optical disc 6. The reflected light from the surface of the optical disc 6 is received by the data readout device 7 through the half mirror 2. The data readout device 7 reads data stored in the optical disc 6 based on the received reflected light.

On the other hand, the laser light generated by the semiconductor laser 1 is received by the laser light detection circuit 3 through the half mirror 2. The laser light detection circuit 3 is a circuit that outputs an electric signal corresponding to the intensity of laser light. In this case, the laser light detection circuit 3 outputs a pair of differential voltage signals, i.e., a first output voltage Vop and a second output voltage Von. The second output voltage Von corresponds to an inverted voltage of the first output voltage Vop relative to a reference voltage.

The laser driver 4 is a circuit that receives the first and second output voltages Vop, Von and controls the intensity of laser light of the semiconductor laser 1 corresponding to the voltage difference between these (Vop−Von). By the feedback control of the laser driver 4, the intensity of laser light generated by the semiconductor laser 1 is controlled so as to be constant. This kind of optical disc device 100 is described in the Japanese Patent Application No. 2003-141767.

The optical disc device 100 having two modes of an operation stop mode (sleep mode) and an operation mode (active mode) has been developed. In this case, the microcomputer 5 outputs a mode switch signal for controlling switching between the operation stop mode and the operation mode. The laser light detection circuit 3 is set to either the operation stop mode or the operation mode in response to the mode switch signal from the microcomputer 5.

Figure 4:
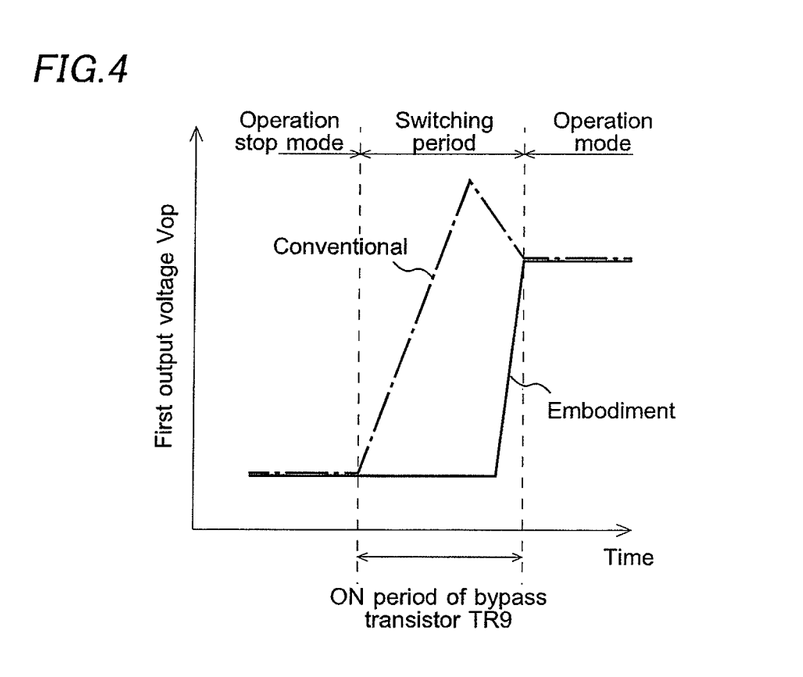
FIG. 4 is a waveform diagram of output voltages of the laser light detection circuit of the embodiment of the invention and a laser light detection circuit of a comparison example.

However, as shown in FIG. 4, when the laser light detection circuit 3 switches from the operation stop mode to the operation mode, there occurs a problem that the first output voltage Vop of the laser light detection circuit 3 transiently increases to near the supply voltage Vcc (a peak output). (see a chain line curve in FIG. 4)

The laser driver 4 in the next stage to the laser light detection circuit 3 thus receives this peak output as an input voltage. Then the input voltage of the laser driver 4 exceeds the absolute maximum rating, and this may cause the breakdown or malfunction of the laser driver 4. This problem may occur when the supply voltage of the laser light detection circuit 3, e.g. 5V is higher than the supply voltage of the laser driver 4, e.g. 3.3V.

The invention is to address the problem described above, and is directed to preventing a peak output occurring when a circuit switches between the operation stop mode and the operation mode so as to prevent the breakdown or malfunction of the next-connected circuit.

SUMMARY OF THE INVENTION

The invention provides a laser light detection circuit including: an amplifier amplifying an inputted signal corresponding to intensity of laser light and outputting the amplified signal; a first transistor having an input terminal to which the signal amplified by the amplifier is applied; a constant-current source connected to an output terminal of the first transistor; a second transistor having an input terminal connected to the output terminal of the first transistor; a bypass transistor connected between the output terminal of the first transistor and the ground; and a control circuit controlling the constant-current source and the bypass transistor so as to form a bypass current route from the constant-current source to the ground through the bypass transistor by starting the operation of the constant-current source and turning on the bypass transistor when the circuit switches from an operation stop mode to an operation mode.

DETAILED DESCRIPTION OF THE INVENTION

A laser light detection circuit 3 of an embodiment of the invention will be described referring to figures. Hereafter, the whole structure of the laser light detection circuit 3 will be described first, and the structure of an amplification circuit 13 in the output stage of the laser light detection circuit 3, which is a main part of the invention, will be described next.

[Structure of Laser Light Detection Circuit 3]

Figure 1:
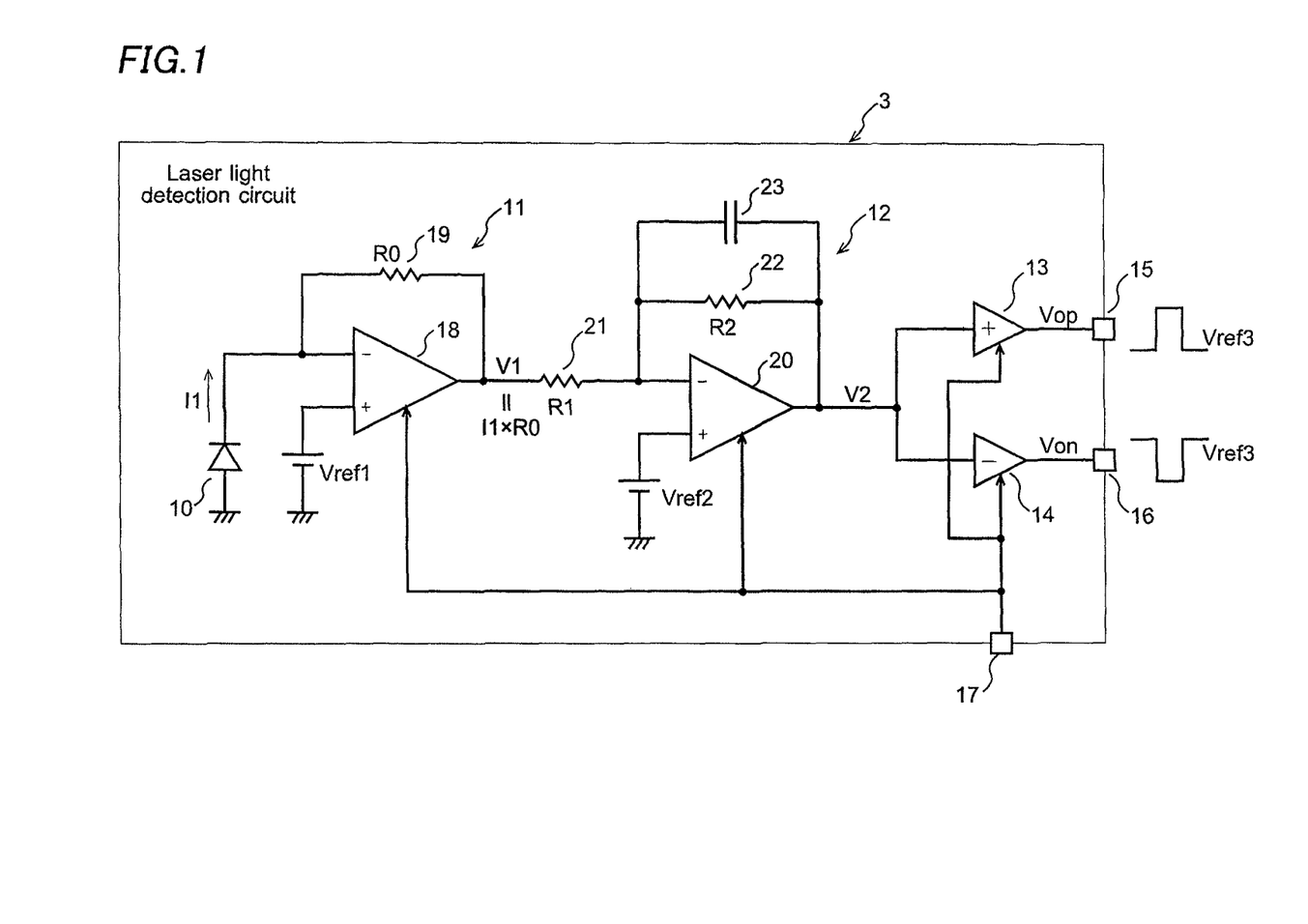
FIG. 1 is a circuit diagram of a laser light detection circuit of an embodiment of the invention.

The laser light detection circuit 3 forms a part of an optical disc device 100 in FIG. 6. FIG. 1 is a circuit diagram of the laser light detection circuit 3. The laser light detection circuit 3 is made of an IC (Integrated Circuit), and this is a circuit that outputs an electric signal corresponding to the intensity of laser light. The laser light detection circuit 3 includes a photodiode 10, a current voltage conversion circuit 11, a front stage amplification circuit 12, output stage amplification circuits (buffer amplifiers) 13, 14, output terminals 15, 16, and an input terminal 17.

The photodiode 10 receives laser light generated by the semiconductor laser 1 in FIG. 6, and generates a current I1 corresponding to the intensity of the laser light. The current voltage conversion circuit 11 is a circuit that converts the current I1 to a voltage V1, and includes an operational amplifier 18 and a resistor 19. A reference voltage Vref1 is applied to the non-inverting input terminal of the operational amplifier 18.

The resistor 19 is connected between the inverting input terminal and the output terminal of the operational amplifier 18. Therefore, the voltage V1, that changes corresponding to the product of the current value of the current I1 and the resistance value of the resistor 19 relative to the reference voltage Vref1, is generated at the output terminal of the operational amplifier 18.

The front stage amplification circuit 12 is an amplification circuit that amplifies the voltage V1, and includes an operational amplifier 20, resistors 21, 22, and a capacitor 23. A reference voltage Vref2 is applied to the non-inverting input terminal of the operational amplifier 20. The resistor 21 is connected between the output terminal of the operational amplifier 18 and the inverting input terminal of the operational amplifier 20. The resistor 22 is connected between the inverting input terminal and the output terminal of the operational amplifier 20.

The capacitor 23 is a capacitor that limits the frequency band of the amplification circuit 12, and is connected between the inverting input terminal and the output terminal of the operational amplifier 20. The direct current gain of the amplification circuit 12 is R2/R1.

Therefore, the operational amplifier 20 operates as an inverting amplification circuit that inverts and amplifies the voltage V1 by the gain R2/R1. Since the reference voltage Vref2 is applied to the non-inverting input terminal of the operational amplifier 20, the voltage V2 at the output terminal changes relative to the reference voltage Vref2.

The amplification circuit 13 in the output stage is a buffer amplifier and outputs a first output voltage Vop generated by amplifying the voltage V2 by a predetermined gain to the output terminal 15. The amplification circuit 14 outputs a second output voltage Von generated by inverting and amplifying the voltage V2 by a predetermined gain to the terminal 16. In other words, the voltage V2 is differentially amplified at the amplification circuits 13, 14. In this case, the second output voltage Von corresponds to an inverted voltage of the first output voltage Vop relative to a reference voltage Vref3.

The laser light detection circuit 3 is set to either the operation stop mode (sleep mode) or the operation mode (active mode) in response to a mode switch signal from a microcomputer 5 in FIG. 6. In detail, the mode switch signal from the microcomputer 5 is applied to the laser light detection circuit 3 through the input terminal 17. For example, when the mode switch signal is L level, the operational amplifiers 18, 20 and the amplification circuits 13, 14 are set to the operation stop mode, and these circuits stop operating. When the mode switch signal is H level, the operational amplifiers 18, 20 and the amplification circuits 13, 14 are set to the operation mode, and these circuits operate.

[Structure of Amplification Circuit 13]

Figure 2:
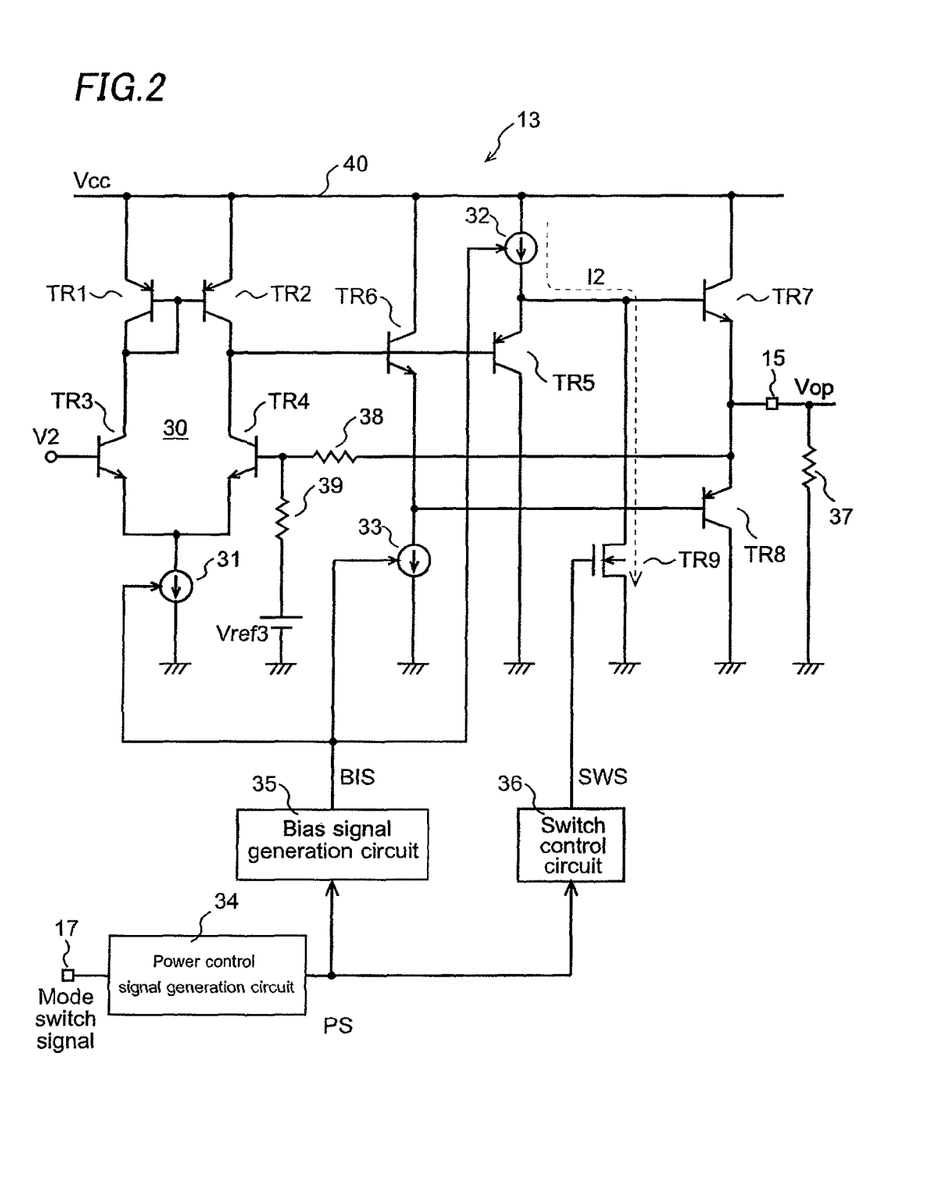
FIG. 2 is a circuit diagram of an amplification circuit in the output stage of the laser light detection circuit of the embodiment of the invention.

FIG. 2 is a circuit diagram of the amplification circuit 13 in the output stage of the laser light detection circuit 3. The amplification circuit 13 includes a differential amplifier 30 (an example of the "amplifier" of the invention) including PNP type transistors TR1, TR2 and NPN type transistors TR3, TR4, a first constant-current source 31, a second constant-current source 32 (an example of the "constant-current source" of the invention), a third constant-current source 33, a PNP type drive transistor TR5 (an example of the "first transistor" of the invention), an NPN type drive transistor TR6, an NPN type output transistor TR7 (an example of the "second transistor" of the invention), a PNP type output transistor TR8, a bypass transistor TR9 made of an N-channel type MOS transistor, a power control signal generation circuit 34, a bias signal generation circuit 35, a switch control circuit 36, a power supply line 40 supplying the supply voltage Vcc to the circuit elements described above, resistors 38, 39 and an output terminal 15. The power control signal generation circuit 34, the bias signal generation circuit 35 and the switch control circuit 36 are an example of the "control circuit" of the invention.

The transistors TR3, TR4 of the differential amplifier 30 form a pair of differential input transistors, and the voltage V2 of the output terminal of the amplification circuit 12 in FIG. 1 is applied to the base of the transistor TR3. The base of the transistor TR4 is connected to the emitters of the output transistors TR7, TR8 through the resistor 38, and the reference voltage Vref3 is applied to the base of the transistor TR4 through the resistor 39.

The first constant-current source 31 is connected to the emitters of the transistors TR3, TR4 of the differential amplifier 30, and supplies an operation current to the differential amplifier 30. The second constant-current source 32 is connected between the emitter of the drive transistor TR5 and the power supply line 40. The third constant-current source 33 is connected between the emitter of the drive transistor TR6 and the ground.

The emitter of the drive transistor TR5 is connected to the base of the output transistor TR7. The emitter of the drive transistor TR6 is connected to the base of the output transistor TR8. The emitters of the output transistors TR7, TR8 are commonly connected to the output terminal 15. An external load resistor 37 is a load resistor provided outside the laser light detection circuit 3 (e.g. a resistor of about 1 MΩ which a measurement probe has), and is connected between the output terminal 15 and the ground.

The bypass transistor TR9 is connected between the connection node of the emitter of the drive transistor TR5 and the second constant-current source 32 and the ground.

The power control signal generation circuit 34 is formed so as to generate and output a power control signal PS in response to the mode switch signal from the microcomputer 5. The bias signal generation circuit 35 is formed so as to generate a bias signal BIS for controlling the switching of the first constant-current source 31, the second constant-current source 32 and the third constant-current source 33 in response to this power control signal PS.

The amplification circuit 13 is set to the operation stop mode when the bias signal BIS is H level. At this time, the supply voltage Vcc is supplied to the power supply line 40, but the first constant-current source 31, the second constant-current source 32 and the third constant-current source 33 stop operating. In other words, the current values of the first constant-current source 31, the second constant-current source 32 and the third constant-current source 33 are set to "0". By this, the differential amplifier 30, and the drive transistors TR5, TR6 becomes in the operation stop state (off state).

When the bias signal BIS turns from H level to L level, the amplification circuit 13 switches from the operation stop mode to the operation mode. By this, the first constant-current source 31, the second constant-current source 32 and the third constant-current source 33 start operating. In other words, the current values of the first constant-current source 31, the second constant-current source 32 and the third constant-current source 33 are set to a constant value except "0". In response to this, the differential amplifier 30, the drive transistors TR5, TR6 start operating.

Furthermore, the switch control circuit 36 generates a switch control signal SWS that is a pulse signal for controlling the switching of the bypass transistor TR9 in response to the power control signal PS. The switch control signal SWS is supplied to the gate of the bypass transistor TR9. When the switch control signal SWS is H level, the bypass transistor TR9 turns on, and when the switch control signal SWS is L level, the bypass transistor TR9 turns off.

Figure 3:
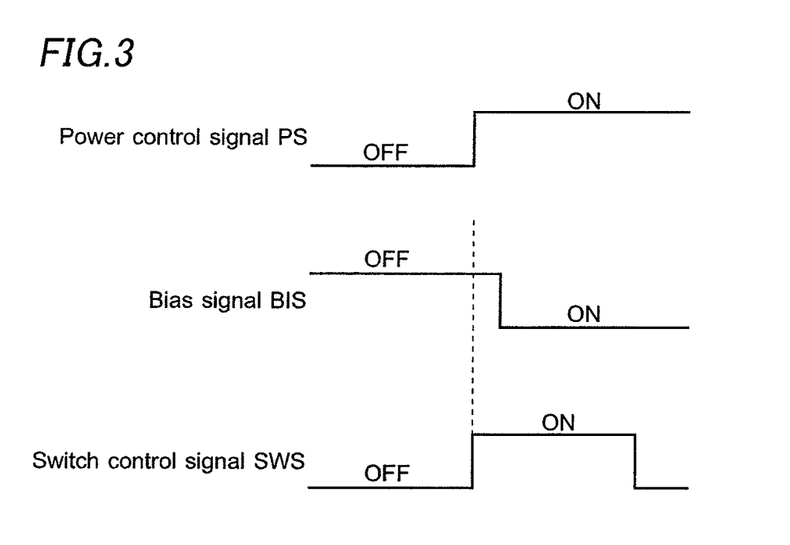
FIG. 3 is an operation timing chart of the laser light detection circuit of the embodiment of the invention. (when the circuit switches from an operation stop mode to an operation mode)

The switch control signal SWS turns from L level to H level immediately when the power control signal PS turns from L level to H level as shown in FIG. 3, and turns from H level to L level after a predetermined time. This switch control signal SWS may be made by a timer circuit or a CR time constant circuit based on the power control signal PS.

With the structure of the amplification circuit 13 described above, when the circuit 13 switches from the operation stop mode to the operation mode, the bypass transistor TR9 keeps the on state for a predetermined period to form a bypass current route from the second constant-current source 32 to the ground through the bypass transistor TR9. Therefore, the base current of the output transistor TR7 is limited, and the phenomenon that the first output voltage Vop of the output terminal 15 transiently increases to near the supply voltage Vcc, i.e. the peak output is prevented.

By this, the input voltage of the laser driver 4 next connected to the laser light detection circuit 3 is limited to below the absolute maximum rating, thereby preventing the breakdown or malfunction of the laser driver 4.

[Operation of Amplification Circuit 13]

(a) An operation example of the amplification circuit 13 when it switches from the operation stop mode to the operation mode will be described referring to FIGS. 3 and 4.

When the power control signal PS turns from L level to H level, the switch control signal SWS turns from L level to H level. Then the bypass transistor TR9 turns on. Furthermore, the bias signal BIS turns from H level to L level. Then the first to third constant-current sources 31, 32, 33 start operating.

At this time, there may occur a case where the second constant-current source 32 starts operating earlier while the drive transistor TR5 is in the off state. For example, this case may occur when the operation start of the first constant-current source 31 is later than that of the second constant-current source 32 by a difference in wiring delay in transmitting the bias signal BIS.

In this case, the current I2 of the second constant-current source 32 does not flow in the drive transistor TR5 that is in the off state, and flows toward the base of the output transistor TR7. However, at this time, since the bypass transistor TR9 turns on, the bypass current route from the second constant-current source 32 to the ground through the bypass transistor TR9 is formed.

It is preferable to turn on the bypass transistor TR9 before the second constant-current source 32 starts operating since this effectively limits the current I2 of the second constant-current source 32 flowing in the base of the output transistor TR7.

The forming of the bypass current route decreases the current flowing in the base of the output transistor TR7 from the second constant-current source 32, and decreases the emitter current of the output transistor TR7. As a result, as shown by a solid line curve in FIG. 4, the peak output of the first output voltage Vop of the output terminal 15 is prevented. When the drive transistor TR5 starts operating after then, the switch control signal SWS turns from H level to L level, and the bypass transistor TR9 turns off. By this, the amplification circuit 13 turns to the ordinary operation mode.

Figure 7:
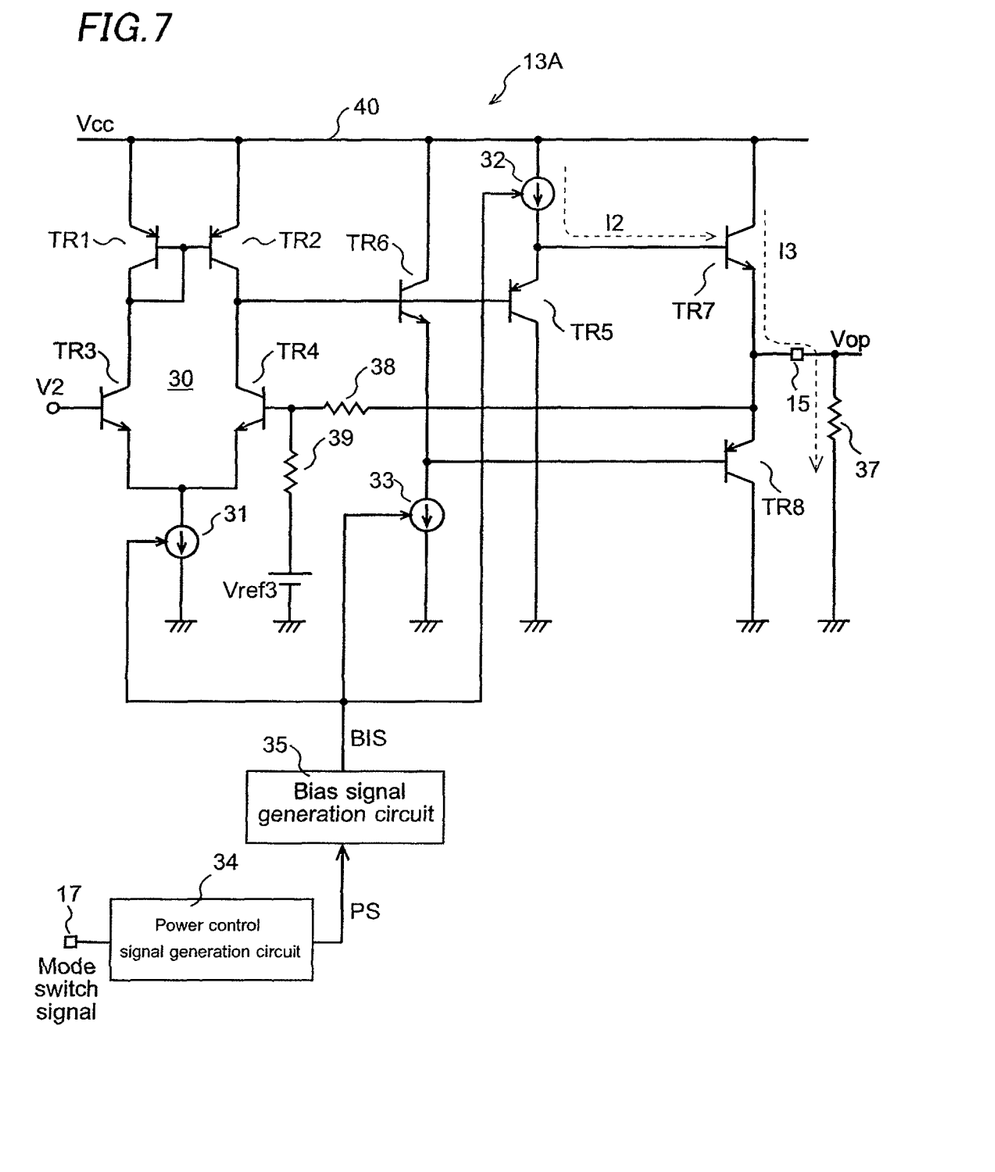
FIG. 7 is a circuit diagram of an amplification circuit of the laser light detection circuit of the comparison example.

On the other hand, since the bypass transistor TR9 is not provided in an amplification circuit 13A of a comparison example in FIG. 7, when the drive transistor TR5 is in the off state and the second constant-current source 32 starts operating, all of the current I2 of the second constant-current source 32 flows in the base of the output transistor TR7. As a result, a large emitter current I3 flows in the output transistor TR7, and this emitter current I3 flows in the external load resistor 37. Therefore, as shown by a chain line curve in FIG. 4, the peak output of the first output voltage Vop of the output terminal 15 occurs.

Figure 5:
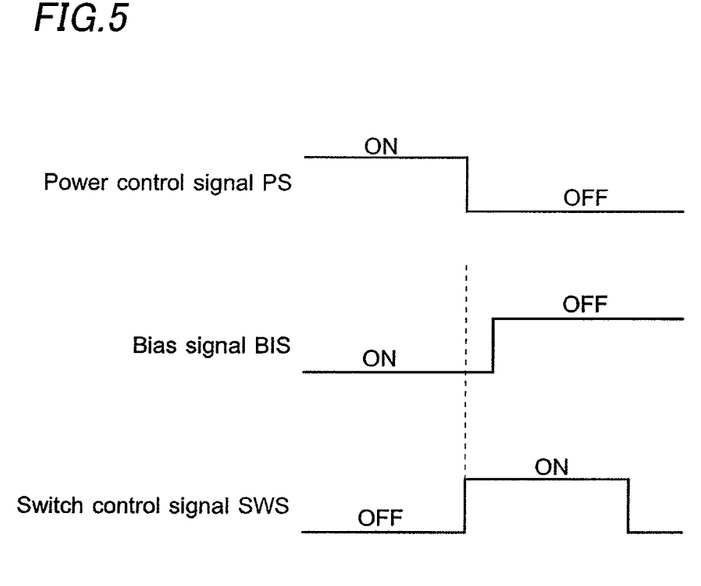
FIG. 5 is an operation timing chart of the laser light detection circuit of the embodiment of the invention. (when the circuit switches from the operation mode to the operation stop mode)

(b) Next, an operation example of the amplification circuit 13 when it switches from the operation mode to the operation stop mode will be described referring to FIG. 5.

When the power control signal PS turns from H level to L level, the switch control signal SWS turns from L level to H level. Then the bypass transistor TR9 turns on. Furthermore, the bias signal BIS turns from L level to H level. Then the first to third constant-current sources 31, 32, 33 stop operating.

At this time, there may occur a case where the drive transistor TR5 turns off earlier while the second constant-current source 32 is still operating.

In this case, the current I2 of the second constant-current source 32 does not flow in the drive transistor TR5 that is in the off state, and flows toward the base of the output transistor TR7. However, at this time, since the bypass transistor TR9 turns on before the second constant-current source 32 stops operating, the bypass current route from the second constant-current source 32 to the ground through the bypass transistor TR9 is formed. By this, in the similar manner, the peak output of the first output voltage Vop of the output terminal 15 is prevented.

On the other hand, since the bypass transistor TR9 is not provided in the amplification circuit 13A of the comparison example in FIG. 7, when the drive transistor TR5 turns off while the second constant-current source 32 is operating, the peak output of the first output voltage Vop of the output terminal 15 occurs for the reason described above.

Although the amplification circuit 13 of the laser light detection circuit 3 is described in the embodiment, the amplification circuit 14 as an inverting amplification circuit may have the same structure. Furthermore, the bypass transistor TR9 is not limitedly made of a MOS transistor, and may be made of other switching device such as a bipolar transistor.

A laser light detection circuit of the invention prevents a peak output when a circuit switches between the operation stop mode and the operation mode and limits the input voltage of the next-connected circuit to below the absolute maximum rating, thereby preventing the breakdown or malfunction of the circuit.

What is claimed is:

1. A laser light detection circuit comprising:
   an amplifier amplifying an inputted signal corresponding to intensity of laser light and outputting the amplified signal;
   a first transistor having an input terminal to which the signal amplified by the amplifier is applied;
   a constant-current source connected to an output terminal of the first transistor;
   a second transistor having an input terminal connected to the output terminal of the first transistor;

a bypass transistor connected between the output terminal of the first transistor and the ground; and a control circuit controlling the constant-current source and the bypass transistor so as to form a bypass current route from the constant-current source to the ground through the bypass transistor by starting the operation of the constant-current source and turning on the bypass transistor when the circuit switches from an operation stop mode to an operation mode.

2. The laser light detection circuit of claim 1, wherein the control circuit turns on the bypass transistor before the start of the operation of the constant-current source.

3. The laser light detection circuit of claim 1, wherein the control circuit controls the constant-current source and the bypass transistor so as to form the bypass current route from the constant-current source to the ground through the bypass transistor by stopping the operation of the constant-current source and turning on the bypass transistor when the circuit switches from the operation mode to the operation stop mode.

4. The laser light detection circuit of claim 1, wherein the control circuit turns on the bypass transistor before the stop of the operation of the constant-current source.

5. The laser light detection circuit of claim 1, further comprising a light receiving element receiving laser light and generating a current corresponding to intensity of the received laser light, and a current voltage conversion circuit converting the current generated by the light receiving element to a voltage signal and outputting the voltage signal, wherein the voltage signal outputted by the current voltage conversion circuit is inputted to the amplifier.

6. The laser light detection circuit of claim 1, wherein the control circuit comprises a power control signal generation circuit generating a power control signal, a bias signal generation circuit generating a bias signal for controlling the constant-current source in response to the power control signal and a switch control circuit for controlling the bypass transistor in response to the power control signal.

7. A laser light detection circuit comprising:

a light receiving element receiving laser light and generating a current corresponding to intensity of the received laser light;

a current voltage conversion circuit converting the current generated by the light receiving element to a voltage signal and outputting the voltage signal;

an amplifier amplifying the voltage signal outputted by the current voltage conversion circuit and outputting the amplified voltage signal;

a first constant-current source supplying an operation current to the amplifier;

a first transistor having a base to which the voltage signal amplified by the amplifier is applied;

a second constant-current source connected to an emitter of the first transistor;

a second transistor having a base connected to the emitter of the first transistor;

a bypass transistor connected between the emitter of the first transistor and the ground; and a control circuit controlling the first and second constant-current sources and the bypass transistor so as to form a bypass current route from the second constant-current source to the ground through the bypass transistor by starting the operations of the first and second constant-current sources and turning on the bypass transistor for a predetermined period when the circuit starts operating.

8. The laser light detection circuit of claim 7, wherein the control circuit turns on the bypass transistor before the start of the operations of the first and second constant-current sources.

9. The laser light detection circuit of claim 7, wherein the control circuit comprises a power control signal generation circuit generating a power control signal, a bias signal generation circuit generating a bias signal for controlling the first and the second constant-current sources in response to the power control signal and a switch control circuit for controlling the bypass transistor in response to the power control signal.

* * * * *